United States Patent [19]
Konno

[11] Patent Number: 5,933,031
[45] Date of Patent: Aug. 3, 1999

[54] PHASE LOCKED LOOP CIRCUIT WITH REDUCED ELECTRICAL POWER CONSUMPTION

[75] Inventor: Hideki Konno, Tokyo, Japan

[73] Assignee: Mitsubishi Denki Kabushiki Kaisha, Tokyo, Japan

[21] Appl. No.: 08/886,361

[22] Filed: Jul. 1, 1997

[30] Foreign Application Priority Data

Feb. 5, 1997 [JP] Japan .................................. 9-022760

[51] Int. Cl.⁶ .................................................. H03L 7/085
[52] U.S. Cl. .................................................. 327/7; 327/12
[58] Field of Search .................................. 327/2, 3, 5, 7, 327/8, 9, 10, 12

[56] References Cited

U.S. PATENT DOCUMENTS

| | | | |
|---|---|---|---|
| 5,159,205 | 10/1992 | Gorecki et al. | 327/150 |
| 5,359,297 | 10/1994 | Hodel et al. | 331/1 A |
| 5,465,075 | 11/1995 | Yaklin | 331/8 |
| 5,515,364 | 5/1996 | Fague | 370/29 |
| 5,523,723 | 6/1996 | Assar et al. | 331/1 A |

FOREIGN PATENT DOCUMENTS 63-240215  10/1988  Japan .

*Primary Examiner*—Tuan T. Lam
*Attorney, Agent, or Firm*—Leydig, Voit & Mayer, Ltd.

[57] ABSTRACT

A phase lock loop circuit includes a phase detector for receiving a reference clock and a feedback clock, a charge pump for receiving a Down pulse and an Up pulse from the phase detector, a loop filter for being charged and discharged by the output from the charge pump, and a voltage controlled oscillator for outputting a frequency signal according to the output voltage of the loop filter, the phase detector including a power cut input terminal, and when a power cut signal is input to the power cut input terminal, a Down pulse and an Up pulse output from the phase detector are forcibly changed to logic "L" level and logic "H" level, respectively, which reduces the power consumption in the phase locked loop circuit.

2 Claims, 14 Drawing Sheets

FIG.5A CLK 
FIG.5B FB 
FIG.5C Down 
FIG.5D Up 
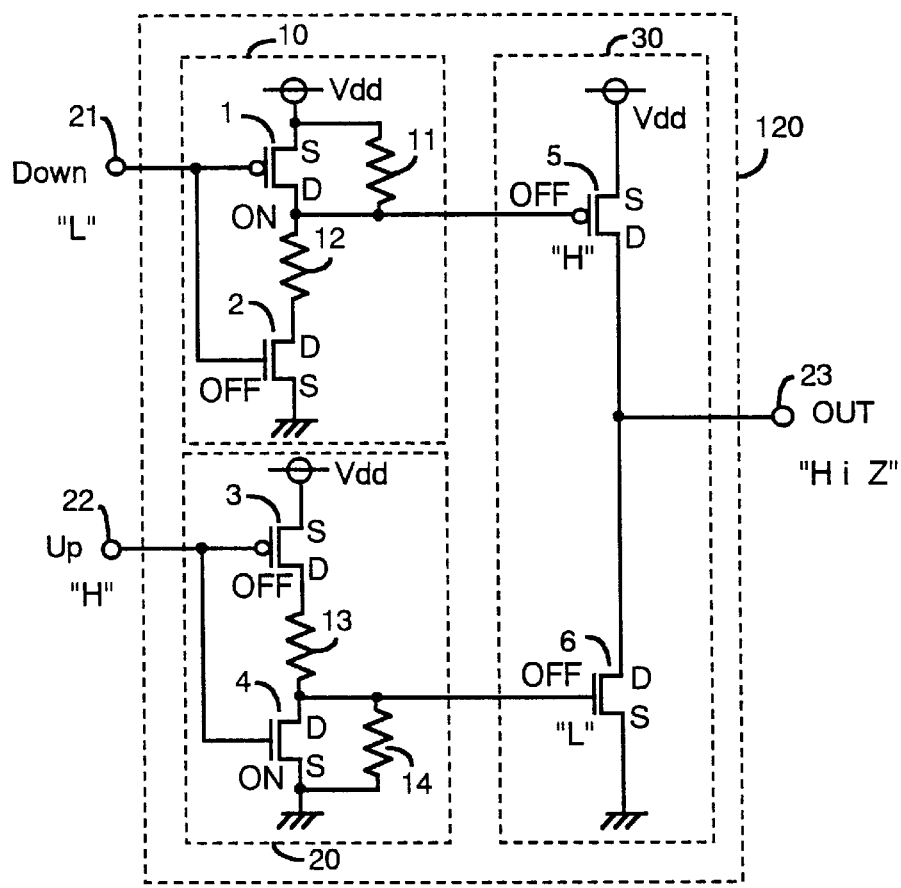
FIG. 6

FIG.7A CLK
FIG.7B FB
FIG.7C Down
FIG.7D Up
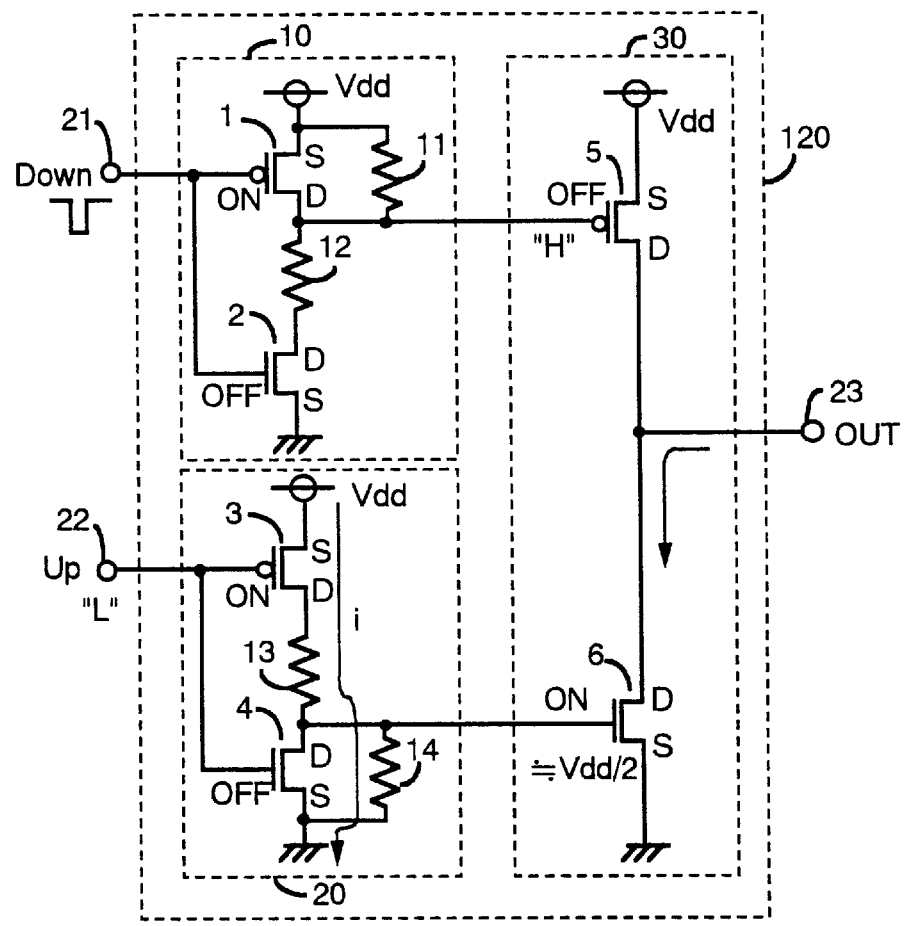
FIG. 8

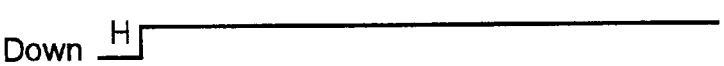
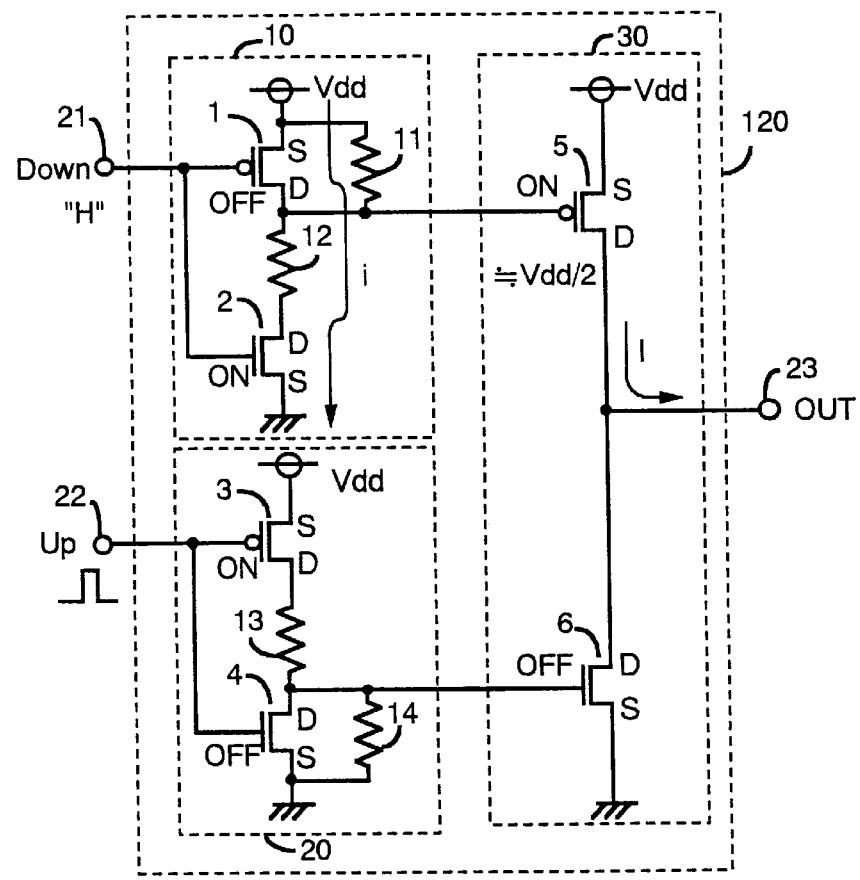
FIG. 10

FIG. 18A (PRIOR ART)   CLK 
FIG. 18B (PRIOR ART)   FB 
FIG. 18C (PRIOR ART)   Down 
FIG. 18D (PRIOR ART)   Up 
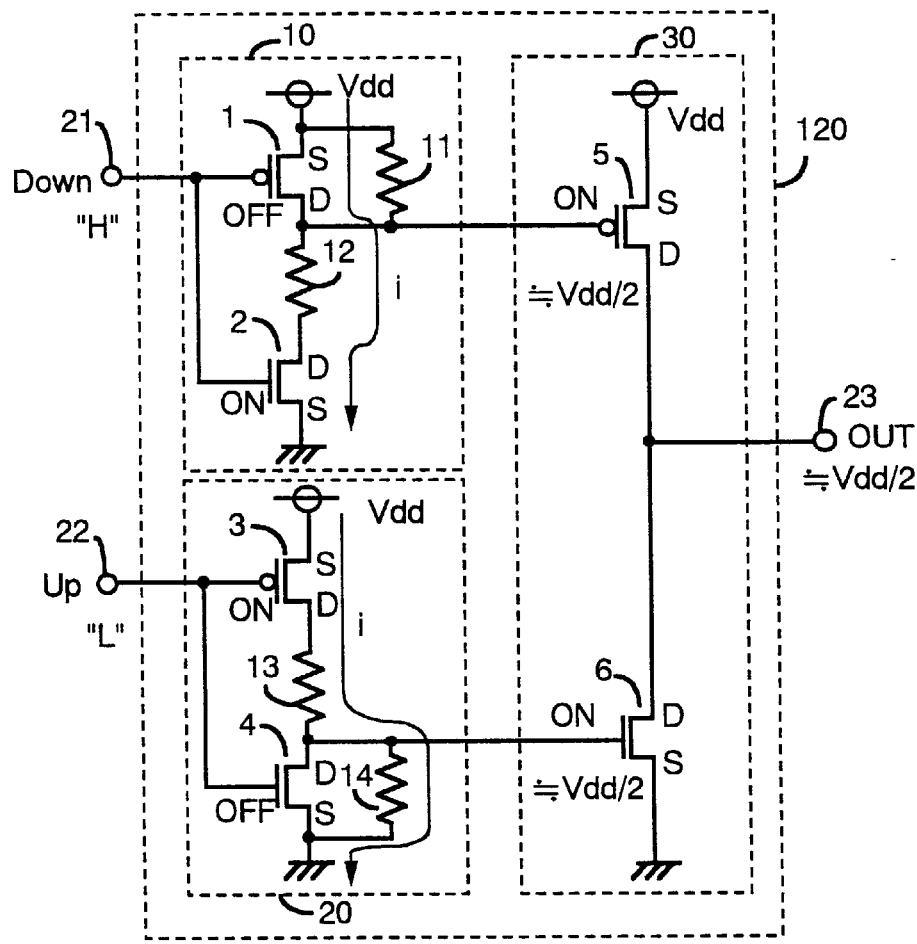
FIG. 19 (PRIOR ART)

5,933,031

PHASE LOCKED LOOP CIRCUIT WITH REDUCED ELECTRICAL POWER CONSUMPTION

BACKGROUND OF THE INVENTION

1. Field of the Invention

The invention relates to a phase locked loop (PLL) circuit with reduced power consumption.

2. Description of the Prior Art

A phase locked loop circuit outputs a signal synchronized with an input signal. Currently, high-speed operation (approximately more than 50 MHz) is required in logic ASI Cs (Application Specific ICs) used in a computer with CMOS circuits. Accordingly, it has been difficult to ignore clock skewing caused by increased wiring resistance when chip area increases. The phase locked loop works to reduce clock skewing among flip-flops (FF) in the chip and adjusts timing of a clock supplied in the FF with a clock supplied from outside the chip.

FIG. 13 shows a conventional phase locked loop circuit. The conventional phase locked loop circuit 100 of FIG. 13 comprises, a phase detector (PD) 110, a charge pump (CP) 120, a loop filter (F) 130, a voltage controlled oscillator (VCO) 140, and a frequency divider (DIV) 150. If the clock frequency input to the phase detector 110 and an output frequency of the voltage controlled oscillator 140 are equal, the frequency divider 150 is unnecessary.

Next, the operation of the phase locked loop circuit 100 is described with reference to FIG. 2 and FIG. 13–FIG. 17. For example, as shown in FIG. 2, the phase detector 1 10 comprises a plurality of logic elements and detects the phase difference between the reference clock CLK and the feedback clock FB. When the phase of the feedback clock FB is behind the phase of the reference clock CLK, a rising pulse having a duration corresponding to the phase difference between the reference clock CLK and the feedback clock FB is input to an Up terminal of the phase detector 110. When the phase of the feedback clock FB is ahead of the phase of the reference clock CLK, a falling pulse having a duration corresponding to the phase difference between the reference clock CLK and the feedback clock FB is output to a Down terminal of the phase detector 110. When the feedback clock FB is synchronized with the reference clock CLK, an UP pulse (logic "L" signal) is output to the Up terminal of the phase detector 110 and a Down pulse (logic "H" signal) is output to the Down terminal of the phase detector 110.

Upon receiving the Up pulse from the phase detector 110, the charge pump 120 charges the loop filter 130. Upon receiving the Down pulse from the phase detector 110, the charge pump 120 discharges the loop filter 130. When the terminal voltage of the loop filter 130 rises upon receiving the high voltage from the charge pump 120, the oscillating frequency of the voltage controlled oscillator 140 rises.

On the other hand, when the terminal voltage of the loop filter 130 drops by receiving the low voltage from the charge pump 120, the oscillating frequency of the voltage controlled oscillator 140 drops. The output frequency of the voltage controlled oscillator 140 is fed back as the feedback clock FB to the phase detector 110 through the frequency divider 150.

At first, when the frequency of the feedback clock FB is lower than the frequency of the reference clock CLK (when the phase of feedback clock FB is behind the phase of the reference clock CLK), since the output frequency of the voltage controlled oscillator 140 rises as stated above, the frequency of the feedback clock FB rises and the phase difference between the reference clock CLK and the feedback clock FB becomes small. Accordingly, the output frequency of the voltage controlled oscillator 140 becomes close to the frequency of the reference clock CLK.

On the other hand, when the frequency of the feedback clock FB is higher than the frequency of the reference clock CLK at the beginning (when the phase of the feedback clock FB is ahead of the phase of the reference clock CLK), the output frequency of the voltage controlled oscillator 140 drops as stated above. Accordingly, the frequency of the feedback clock FB drops and the phase difference between the reference clock CLK and the feedback clock FB becomes small.

In this way, the output frequency of the voltage controlled oscillator 140 becomes close to the frequency of the reference clock CLK. As stated above, even if a frequency of the feedback clock FB (the frequency proportional to the output frequency of the voltage controlled oscillator 140) is higher or lower than the frequency of the reference clock CLK, the phase locked loop circuit 100 finally operates to make the frequency of the feedback clock FB close to the frequency of the reference clock CLK. As a result, the frequency of the voltage controlled oscillator 140 is locked to a fixed frequency.

The operation of each part of the phase locked loop circuit 100 is described below. FIG. 14 shows a detailed circuit of the charge pump 120 of FIG. 13. The charge pump 120 is an analog circuit comprising a plurality of resistors and a plurality of CMOS transistors. The analog circuit controls a minute current flowing through the transistors of an output stage in response to the Up pulse and the Down pulse from the phase detector 110 which are input to the Up terminal and the Down terminal, respectively. Further, the transistors of the charge pump output stage contribute greatly to the phase detector gain.

The detailed circuit of the charge pump 120 of FIG. 14 comprises of a Down pulse processing circuit 10, an Up pulse processing circuit 20, an output signal processing circuit 30, P type MOS transistors 1, 3, 5, N type MOS transistors 2, 4, 6, a Down pulse input terminal 21 wherein the Down pulse is input, an Up pulse input terminal 22 wherein the Up pulse is input, and an output terminal 23 connected to the charge pump 120.

In the Down pulse processing circuit 10, the Down pulse input terminal 21 is connected to the gate of the P type MOS transistor 1 and to the gate of the N type MOS transistor 2. The source of the P type MOS transistor 1 is connected to the power supply Vdd and the drain of the P type MOS transistor 1 is connected to the drain of the N type MOS transistor 2 through the resistor 12. The source of the N type MOS transistor 2 is grounded and the resistor 11 is connected between the power supply Vdd and the drain of the P type MOS transistor 1.

In the Up pulse processing circuit 20, the Up pulse input terminal 22 is connected to the gate of the P type MOS transistor 3 and to the gate of the N type MOS transistor 4. The source of the P type MOS transistor 3 is connected to the power supply Vdd and the drain of the P type MOS transistor 3 is connected to the drain of the N type MOS transistor 4 through the resistor 13. The source of the N type MOS transistor 4 is grounded. The resistor 14 is connected between the drain of the N type MOS transistor 4 and the ground.

In the output signal processing circuit 30, the source of the P type MOS transistor 5 is connected to the power supply Vdd and the drain of the P type MOS transistor 5 is connected to the drain of the N type MOS transistor 6. The source of the N type MOS transistor 6 is grounded. The gate of the P type MOS transistor 5 is connected to the connection of the resistor 11 to the resistor 12 and the gate of the N type MOS transistor 6 is connected to the connection of the resistor 13 to the resistor 14. The output terminal 23 is connected to the connection of the drain of the P type MOS transistor 5 to the drain of the N type MOS transistor 6.

FIG. 15 shows a construction of a conventional loop filter 130. As shown in FIG. 15, the loop filter 130 includes of a resistor 191 and a capacitor 192. The values of the resistor 191 and the capacitor 192 influence the stability and adaptability of the whole phase locked loop circuit.

FIG. 16 shows an example of a conventional frequency divider 150. The conventional frequency divider 150 of FIG. 16 comprises an input terminal 151, a first flip-flop 152, a second flip-flop 153, an output terminal 154, and a power cut signal input terminal 155. The output signal from the input terminal 151 is input to an input terminal T of the frequency divider 150, the input terminal T is connected to an input terminal T1 of the flip-flop 152, an output terminal Q1 of the flip-flop 152 is connected to an input terminal T2 of the flip-flop 153, an output terminal Q2 of the flip-flop 153 is output to an output terminal Q of the frequency divider 150, and an output terminal Q is connected to the output terminal 154. The power cut signal input terminal 155 is the terminal at which a power cut signal for stopping operating of the frequency divider 150 is input. This power cut signal input terminal 155 is connected to a reset terminal R of the frequency divider 150 and the reset terminal R is connected to a reset terminal R1 of the flip-flop 152 and to a reset R2 terminal of the flip-flop 153. When the flip-flops 152 and 153 receive the power cut signal at the reset terminal R1 and R2, the flip-flops 152 and 153 are reset and stop supplying the feedback clock FB from the output terminal Q to the phase detector 110.

FIG. 16 shows, for example, a frequency divider having a ¼ dividing ratio which is used when the reference clock CLK is roughly ¼ of the output frequency of the voltage controlled oscillator 140. When the dividing ratio between the reference clock CLK and the output frequency of the voltage controlled oscillator 140 is other than as described above, it is necessary to change the dividing ratio of the frequency divider. This dividing ratio can be easily changed by increasing the number of flip flop stages.

In the frequency divider 150, the signal input from the voltage controlled oscillator 140 to the input terminal 151 is divided by 2 at the flip-flop 152. Further, the output of the flip-flop 152 is divided by 2 at the flip-flop 153. From the output terminal 154, a frequency divided by 4 is supplied as the feedback clock FB signal to the phase detector 110.

FIG. 17 shows a construction of a voltage controlled oscillator 140. The voltage controlled oscillator 140 of FIG. 17 comprises a control voltage input terminal 141, a power cut signal input terminal (PC) 142, an output terminal 143, a P type MOS transistor 144, an N type MOS transistor 145, an N type MOS transistor 146, a P type MOS transistor 147, an N type MOS transistor 148, input selectors 41-1 to 41-5 including P type MOS transistors, input selectors 42-1 to 42-5 including N type MOS transistors, inverters 43-1 to 43-5, an N type MOS transistor 45, a P type MOS transistor 46, an N type MOS transistor 47, and an inverter 48.

The P type MOS transistor 144, the N type MOS transistor 145, and the N type MOS transistor 146 are connected in series as shown in FIG. 17. The source of the P type MOS transistor 144 is connected to the power supply Vdd and the source of the N type MOS transistor 146 is connected to the ground. The gate of the N type MOS transistor 145 is connected to the control voltage input terminal 141. The P type MOS transistor 144 and the P type MOS transistor 147 are connected as a current mirror circuit. The P type MOS transistor 147 and the N type MOS transistor 148 are similarly connected between the power supply Vdd and the ground. The P type MOS transistors 41-1 to 41-5 are respectively connected to the P type MOS transistor 144 in a current mirror circuit. The N type MOS transistors 42-1 to 42-5 are respectively connected to the N type MOS transistor 148 as a current mirror circuit. The inverters 43-1 to 43-5 are connected between the P type MOS transistors 41-1 to 41-5 and the N type MOS transistors 42-1 to 42-5, respectively. The output terminal of the inverter 43-5 is connected to the input terminal of the inverter 43-1.

The P type MOS transistor 46 and the N type MOS transistor 47 are connected in series between the power supply Vdd and the ground. The gate terminals of the P type MOS transistor 46 and the N type MOS transistor 47 are connected together to the output terminal of the inverter 43-5. The connection of the drain of the P type MOS transistor 46 to the drain of the N type MOS transistor 47 is connected to the output terminal 143. The N type MOS transistor 45 is connected between the output terminal of the inverter 43-5 input to the power cut signal input terminal 142 is input to the gate of the N type MOS transistor 146. Further, the power cut signal is input to the gate of the N type MOS transistor 45 through the inverter 48.

The operation of the voltage controlled oscillator 140 is briefly described below. The central portion of the voltage controlled oscillator 140 comprises current mirror circuits for controlling the current, and the inverter ring oscillators 43-1 to 43-5 with an odd number of stages for the VCO. The oscillating frequency of the VCO is determined by the current flowing through the current mirror circuit and this current is controlled by the resistance of the current mirror circuit. The same current is supplied to each inverter of the succeeding stage. If the current is large, the oscillating frequency of the output is high. If the current is small, the oscillating frequency of the output is low. The current at the current mirror circuit is determined by the voltage applied to the control voltage input terminal 141. When the voltage of the control voltage input terminal 141 becomes large, a current flowing through the current mirror circuit becomes large, since an current flowing through the N type MOS transistor 145, in other words, a current flowing through the P type MOS transistor 144 becomes large. The output of the inverter ring oscillator is taken out via a buffer including the series circuit of the P type MOS transistor 46 and the N type MOS transistor 47 to the output terminal 143.

The power cut signal applied to the power cut signal input terminal 142 is usually logic "H". When the power cut is necessary, however, a signal of logic "L" is applied. When the power cut signal becomes the logic "L", the N type MOS transistor 146 turns off, so that all current flowing to the current mirror circuit stops and the inverter ring oscillator stops oscillating. Accordingly, at this time, the power consumption of the voltage controlled oscillator 140 becomes small.

On the other hand, since the logic "H" inverted by the inverter 48 is applied to the N type MOS transistor 45, the N type MOS transistor 45 turns on. Accordingly, the P type MOS transistor 46 turns on and the N type MOS transistor 47 turns off, so that the output terminal 143 is fixed at the logic "H".

Next, the operation of the conventional charge pump 120 is explained below. The operation of the charge pump has the following three states. In a first state, the feedback clock FB synchronizes with the reference clock CLK. In a second state, the phase of the feedback clock FB is ahead of the phase of the reference clock CLK. In a third state, the phase of the feedback clock FB is behind the phase of the reference clock CLK. FIG. 18A–FIG. 18D are timing charts showing a relationship between the Down pulse and the Up pulse when the feedback clock FB synchronizes with the reference clock CLK. FIG. 19 illustrates the operation of the charge pump 120 when the feedback clock FB synchronizes with the reference clock CLK.

Next, the operation of the charge pump 120 in such a state when the feedback clock FB synchronizes with the reference clock CLK is described. FIG. 18A shows a reference clock CLK signal, FIG. 18B shows a feedback clock FB signal, FIG. 18C shows a Down pulse, and FIG. 18D shows an Up pulse. When the feedback clock FB synchronizes with the reference clock CLK, the Down pulse from the phase detector 110 is the logic "H" and the Up pulse is the logic "L". When such a Down pulse and an Up pulse are input to the Down pulse input terminal 21 and the Up pulse input terminal 22 of FIG. 19, respectively, the charge pump 120 works as follows.

When the Down pulse (logic "H") is input to the Down pulse input terminal 21, the N type MOS transistor 2 turns on and the P type MOS transistor 1 turns off. Accordingly, a current flows through the N type MOS transistor 2 through the resistor 11 and the resistor 12 from the power supply Vdd, so that the potential at the connection of the resistor 11 to the resistor 12 becomes substantially Vdd/2. Accordingly, the P type MOS transistor 5 turns on.

On the other hand, when the Up pulse (logic "L") is input to the Up pulse input terminal 22, the P type MOS transistor 3 turns on and the N type MOS transistor 4 turns off. Accordingly, in this case, a current flows through the resistor 13 and the resistor 14 through the P type MOS transistor 3 from the power supply Vdd to the ground, and the potential at the connection of the resistor 13 to the resistor 14 becomes substantially Vdd/2. Accordingly, the N type MOS transistor 6 turns on. Accordingly, since both the P type MOS transistor 5 and the N type MOS transistor 6 turn on with high resistance and the voltage at the output terminal 23 becomes Vdd/2, the output impedance of the charge pump 120 becomes high.

On the other hand, when the phase of the feedback clock FB is ahead of the phase of the reference clock CLK, the falling pulse having a pulse duration corresponding to the phase difference between the feedback clock FB and the reference clock CLK is output from the Down terminal of the phase detector 110. Due to this falling pulse, the charge pump 120 discharges the capacitor of the loop filter 130 connected to the outside of the output terminal 23. In other words, it pulls the current. Therefore, since an input voltage of the voltage controlled oscillator 140 decreases, the output frequency of the voltage controlled oscillator 140 falls, the phase of the feedback clock FB lags, the phase of the feedback clock FB becomes near to the phase of the reference clock CLK.

On the other hand, when the phase of the feedback clock FB is behind the phase of the reference clock CLK, a rising pulse having a pulse duration corresponding to the phase difference between the feedback clock FB and the reference clock CLK is output from the Up terminal of the phase detector 110. Due to this rising pulse, the charge pump 120 charges the capacitor of the loop filter 130 connected to the outside of the output terminal 23. In other words, it pushes the current. Therefore, since an input voltage of the voltage controlled oscillator 140 rises, the output frequency rises, the phase of the feedback clock FB gains, and the phase of the feedback clock FB becomes near the reference clock CLK.

As described above, the phase detector 110 compares the phase of the feedback clock FB with the phase of the reference clock CLK received from the outside, and outputs pulses from the transistors of the last stage of the phase detector 110 according to difference of the phase. The ON/OFF time of the transistors of the output stage in the charge pump 120 is controlled according to the pulse duration of the pulses received from the phase detector 110. A minute current is exchanged between the transistors in the charge pump 120 and the capacitor only during a minute pulse duration. When the phase of the feedback clock FB is behind the phase of the reference clock CLK, the P channel transistor 5 of the output stage of the charge pump 120 turns on, and a current is supplied to the capacitor from a power supply. Conversely, when the phase of the feedback clock FB is ahead of the phase of the loop filter 130, the N channel transistor 6 of the output stage turns on and pulls a current from the capacitor. The output current from the charge pump 120 is integrated by the loop filter 130 to obtain the voltage information, and the voltage controlled oscillator 140 outputs a frequency signal in response to the input voltage.

In the conventional phase locked loop circuit, when the phase locked loop is not working (when the feedback clock FB synchronizes with the reference clock CLK), the Power cut input terminal is arranged only in the VCO as shown in FIG. 13. In the VCO circuit of FIG. 17, when a signal of logical "L" is input to the power cut input terminal (PC), the N type MOS transistor 146 turns off to cut the current which flows through the current mirror. Therefore, the current is not supplied to the inverter ring oscillator of the VCO at the succeeding stage, so that the oscillation of the VCO stops. The power cut signal is supplied via the power cut signal input terminal (PC) 142 to the N type MOS transistor 45. This transistor 45 turns on during the power cut state, and the potential of the gate of the P type MOS transistor 46 and of the gate of the N type MOS transistor 47 become logic "L". As a result, the output of the VCO is fixed by logic "H" through the P type MOS transistor 46.

The phase detector 110 in the conventional phase locked loop circuit does not have the power cut input terminal. The conventional phase locked loop circuit stops the oscillation of the VCO by the power cut signal from the power cut input terminal when the phase locked loop is not working. However, the operation of the charge pump 120 does not to stop completely. Accordingly, there is a problem that the power is consumed during a power cut off, since the charge pump 120 works even while the VCO stops.

SUMMARY OF THE INVENTION

It is an object of the present invention to provide a phase lock loop circuit which reduces the power consumption when the phase locked loop is not working by newly providing a power cut circuit in the phase detector. Recent computer systems have a tendency to reduce the consumption of power. The present invention greatly contributes to reducing power consumption of a phase locked loop in an IC chip.

According to one aspect of the invention, a phase locked loop (PLL) circuit comprises a phase detector for receiving a reference clock and a feedback clock, and generating Up pulse and Down pulse according to phase relationship of the reference clock and the feedback clock; a charge pump for receiving Down pulses and Up pulses from the phase detector; a loop filter for being charged and discharged by an output from the charge pump, and generating a voltage in response to charging and discharging of the loop filter; and a voltage controlled oscillator for outputting a frequency signal according to the output voltage of the loop filter, wherein the phase detector includes a power cut input terminal, and when a power cut signal is input to the power cut input terminal, a Down pulse and an Up pulse output from the phase detector are forcibly changed to opposite logic levels from each other.

According to another aspect of the invention, the phase locked loop circuit further comprises a frequency divider for dividing the frequency signal from the voltage controlled oscillator to provide a feedback clock of lowered frequency to the phase detector.

According to a further aspect of the invention, the phase detector further comprise a clock terminal for receiving the reference clock; a feedback clock terminal for receiving a feedback clock; a plurality of 2-input NAND circuits for receiving the reference clock and the feedback clock; a NOR circuit for carrying out a NOR operation on signals output by the 2-input NAND circuits in response to the reference clock and the feedback clock; a first inverter for inverting an output signal from the NOR circuit; first and second multiple input NAND circuits for receiving signals from the 2-input NAND circuits, the first inverter, and the power cut input terminal; a second inverter connected to an output terminal of the first multiple input NAND circuit; a Down terminal connected to an output terminal of the second inverter for outputting a Down pulse; and an Up terminal connected to an output terminal of the second multiple input NAND circuit for outputting an Up pulse.

The phase detector forcibly changes the Down pulse and the Up pulse to opposite logic levels from each other, according to the power cut signal supplied via the power cut input terminal to additional input terminals of the first and second multiple input NAND circuits.

According to still a further aspect of the invention, the phase detector in the phase locked loop circuit comprises: a clock terminal for receiving the reference clock; a feedback clock terminal for receiving the feedback clock.

The phase detector in the phase locked loop circuit further comprises a main frame portion which includes a plurality of 2-input NAND circuits for receiving the reference clock and the feedback clock, a NOR circuit for carrying out a NOR operation on signals output by the 2-input NAND circuits in response to the reference clock and the feedback clock; a first inverter for inverting an output signal from the NOR circuit, first and second multiple input NAND circuits for receiving output signals from the 2-input NAND circuits, the first inverter, and the power cut input terminal, a second inverter connected to an output terminal of the first multiple input NAND circuit.

The phase detector in the phase locked loop circuit further includes a first 2-input NAND circuit having a first input terminal connected to an output of the second inverter in the main frame portion and a second input terminal connected to the power cut input terminal; a third inverter having an input connected to an output terminal of the second multiple input NAND circuit, a second 2-input NAND circuit having a first input terminal connected to an input of the third inverter and a second input terminal connected to the power cut input terminal; a fourth inverter having an input connected to an output terminal of the first 2-input NAND circuit; a Down terminal connected to an output terminal of the fourth inverter for outputting a Down pulse; and an Up terminal connected to an output terminal of the second 2-input NAND circuit for outputting an Up pulse.

The phase detector forcibly changes the Down pulse and the Up pulse to opposite logic levels from each other, according to the power cut signal supplied via the power cut input terminal to the second input terminals of the first and second 2-input NAND circuits.

BRIEF DESCRIPTION OF THE DRAWINGS

FIG. 5A–FIG. 5D are timing charts showing a relation between a Down pulse and an Up pulse when the feedback clock FB synchronizes with the reference clock CLK in the present invention.

FIG. 6 illustrates the operation of a charge pump when the feedback clock FB synchronizes with the reference clock CLK in the present invention.

FIG. 7A–FIG. 7D are timing charts showing a relation between the Down pulse and the Up pulse when the phase of the feedback clock FB is ahead of the phase of the reference clock CLK.

FIG. 8 illustrates the operation of a charge pump when the phase of the feedback clock FB is ahead of the phase of the reference clock CLK.

FIG. 9A–FIG. 9D are timing charts showing a relation between the Down pulse and the Up pulse when the phase of the feedback clock FB is behind the phase of the reference clock CLK.

FIG. 10 illustrates the operation of a charge pump when the phase of the feedback clock FB is behind the phase of the reference clock CLK.

FIG. 18A–FIG. 18D are timing charts of a conventional phase detector showing a relation between a Down pulse and an Up pulse when the feedback clock FB synchronizes with the reference clock CLK.

FIG. 19 illustrates the operation of the conventional charge pump when the feedback clock FB synchronizes with the reference clock CLK.

DETAILED DESCRIPTION OF THE PREFERRED EMBODIMENTS

Embodiment 1.

One embodiment of a phase locked loop circuit according to the present invention is described below with reference to the FIG. 1. The phase locked loop (PLL) circuit 100 of FIG. 1 comprises a phase detector (PD) 110, a charge pump (CP) 120, a loop filter (F) 130, a voltage controlled oscillator (VCO) 140, and a frequency divider (DIV) 150. When a clock frequency input to the phase detector 110 and an output frequency of the voltage controlled oscillator 140 are equal, the frequency divider 150 is unnecessary.

Figure 1:
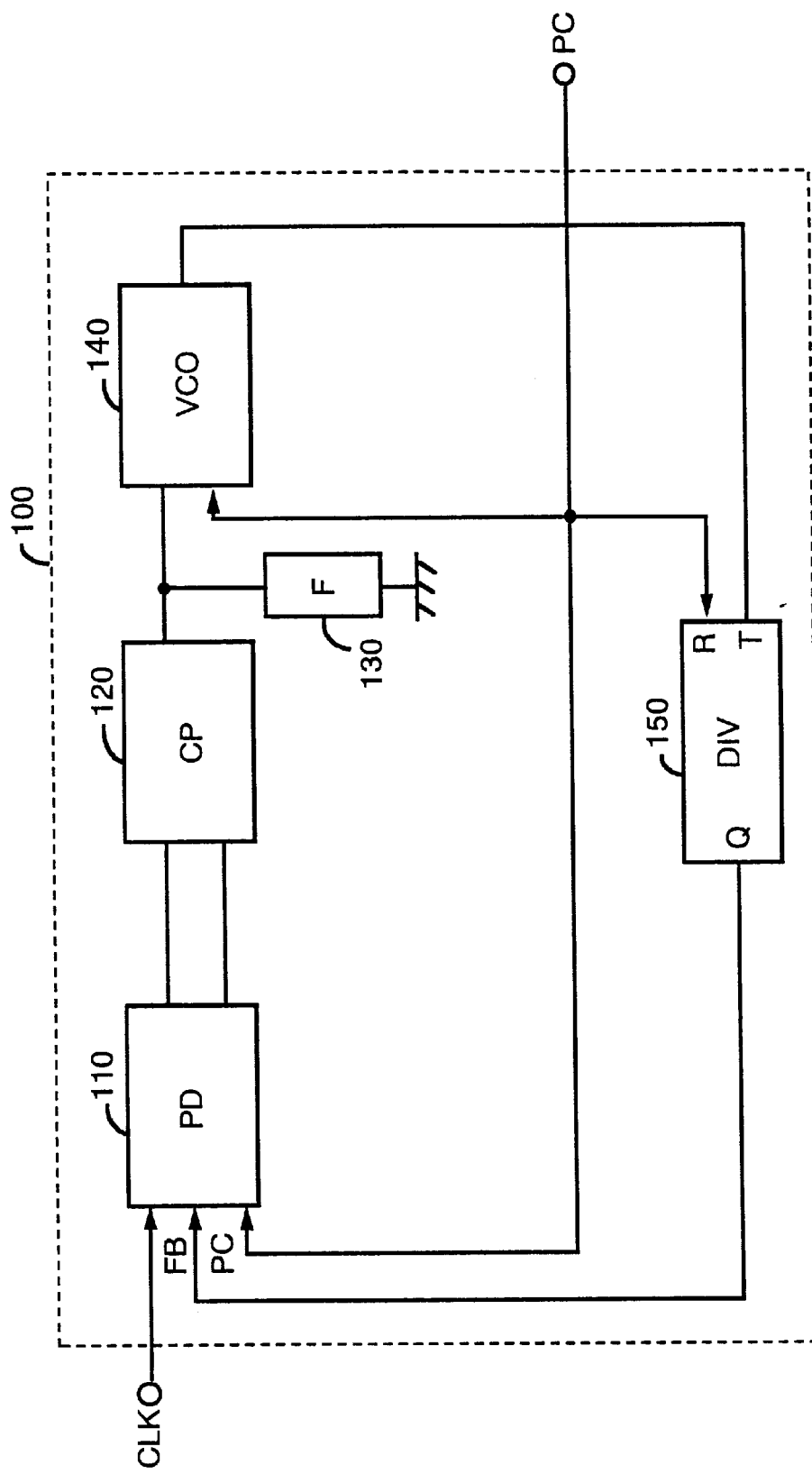
FIG. 1 shows one embodiment of phase locked loop circuit according to the present invention.
Figure 13:
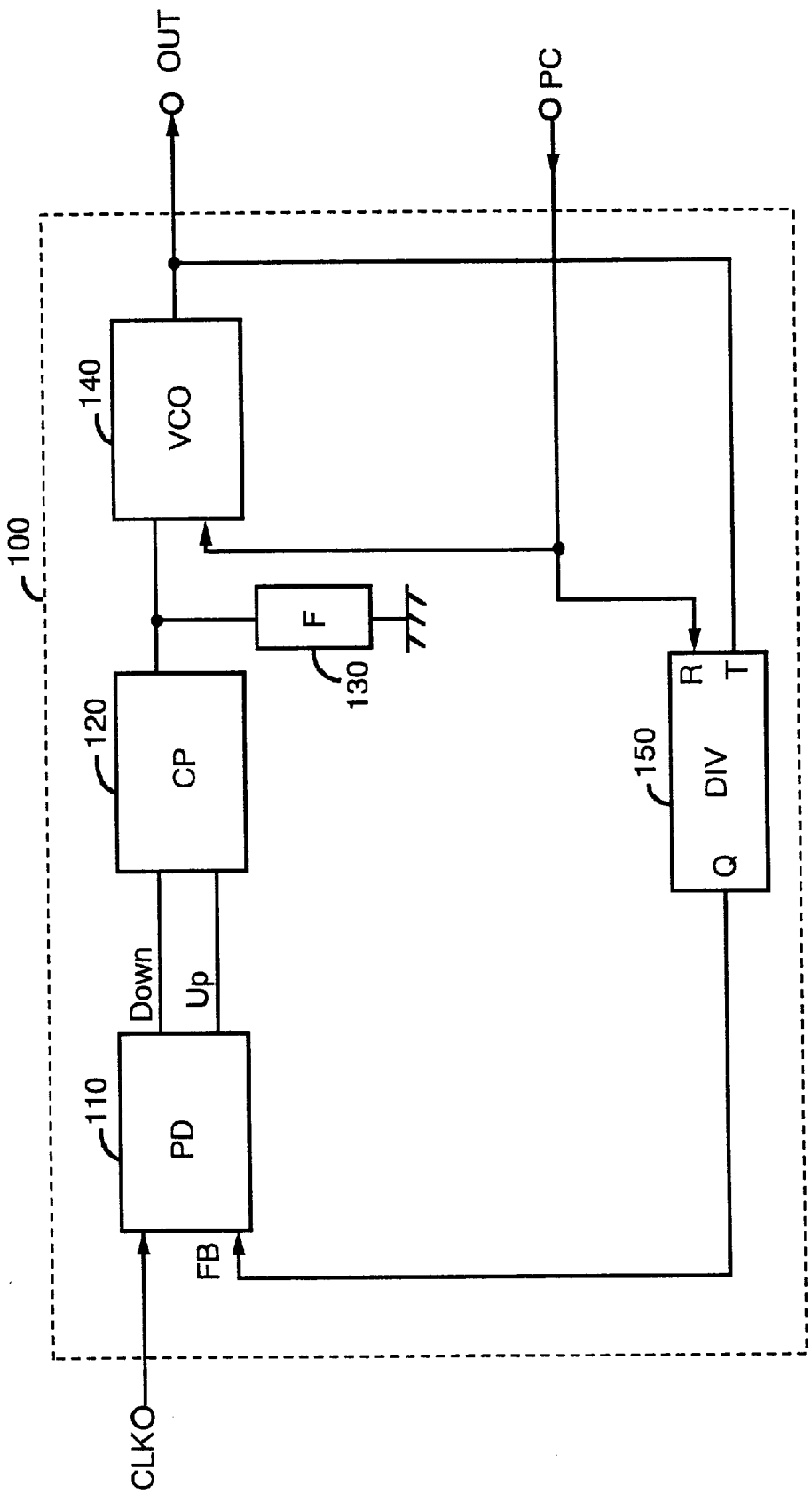
FIG. 13 shows a conventional phase locked loop circuit.
Figure 14:
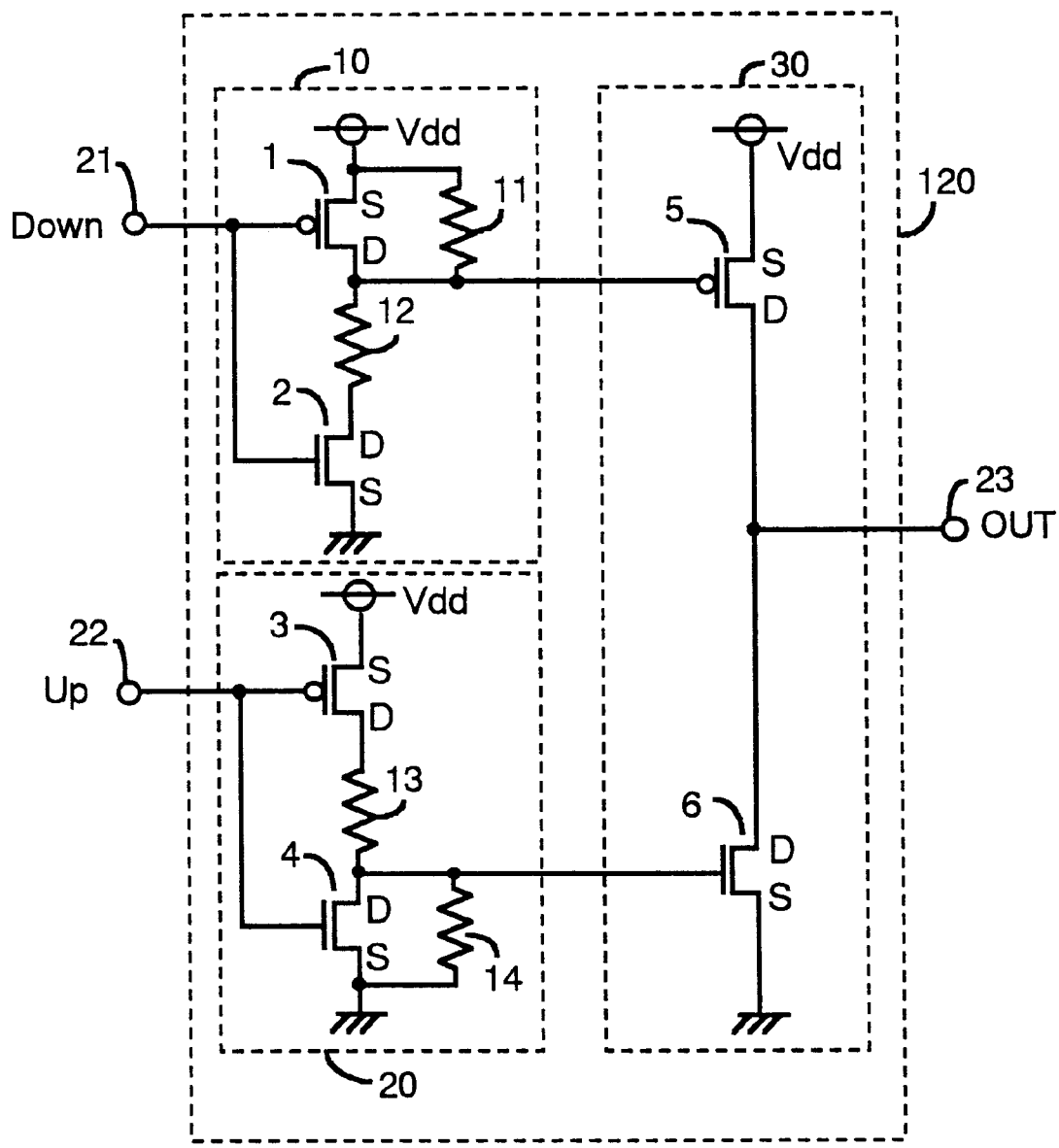
FIG. 14 shows a conventional charge pump.
Figure 15:
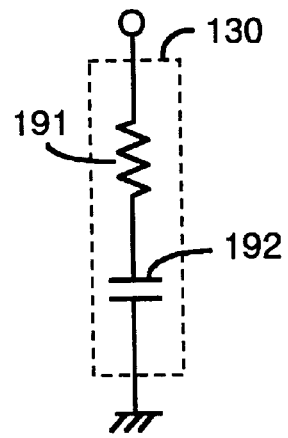
FIG. 15 shows a conventional loop filter.
Figure 16:
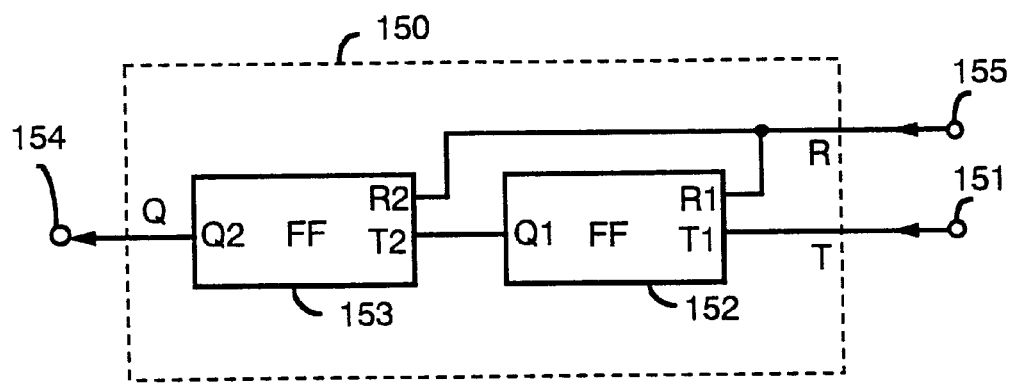
FIG. 16 shows a conventional frequency divider.
Figure 17:
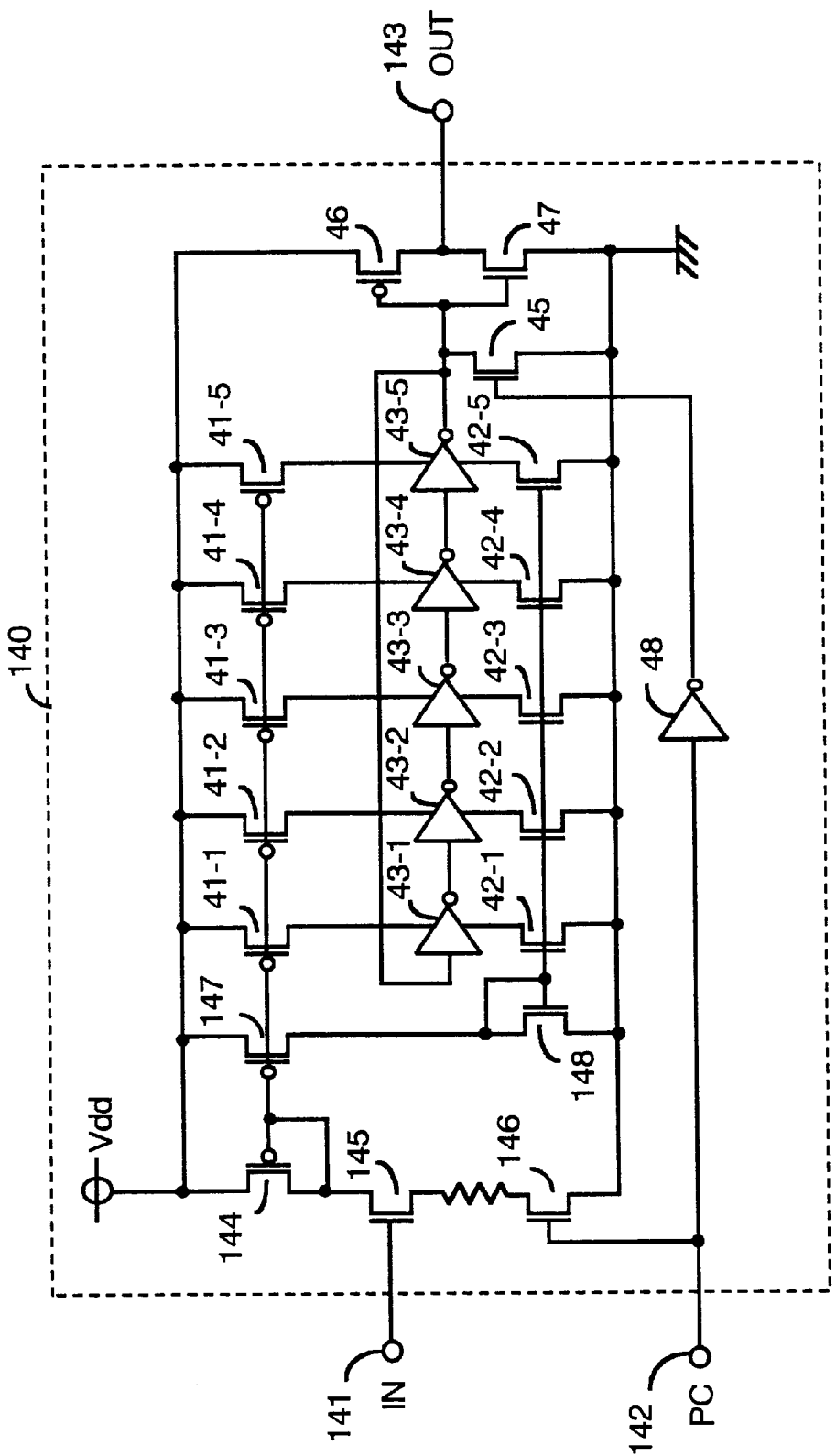
FIG. 17 shows a conventional voltage controlled oscillator.

The operation of the phase locked loop circuit 100 is explained with respect to FIG. 1. Compared with the prior art of FIG. 13, the present invention of FIG. 1 is greatly different in that the power of the charge pump 120 is cut off while the power of the voltage controlled oscillator 140 is cut off, by the phase detector 110 in which a power cut input terminal is provided in the phase detector 110. Other technical constructions are similar to those of the prior art.

The phase detector 110 comprising a plurality of logic elements detects the phase difference between the reference clock CLK and the feedback clock FB. When the phase of the feedback clock FB is behind the phase of the reference clock CLK, a rising pulse having a pulse duration corresponding to the difference is output to the Up terminal of the phase detector 110. When the phase of the feedback clock FB is ahead of the phase of the reference clock CLK, a falling pulse having a pulse duration corresponding to the difference is output to a down terminal of the phase detector 110. An important feature of the invention lies in that a signal of logic "L" is output as a Down pulse and a signal of logic "H" is output as an Up pulse when a power cut signal is input.

When the charge pump 120 receives the Up pulse from the phase detector 110, the charge pump 120 charges the loop filter 130. Upon receiving the Down pulse, the charge pump 120 discharges the loop filter 130. When the terminal voltage of the loop filter 130 rises by receiving the Up pulse from the charge pump 120, the oscillating frequency of the voltage controlled oscillator 140 rises.

On the other hand, when the terminal voltage of the loop filter 130 drops by receiving the Down pulse from the charge pump 120, the oscillating frequency of the voltage controlled oscillator 140 drops. The output frequency of the voltage controlled oscillator 140 is fed back as a feedback clock FB to the phase detector 110 via the frequency divider 150.

First, when the frequency of the feedback clock FB is lower than the frequency of the reference clock CLK (when the phase of the feedback clock FB is behind the phase of the reference clock CLK), the frequency of the feedback clock FB rises and the phase difference between the feedback clock and the reference clock CLK becomes small, since the output frequency of the voltage controlled oscillator 140 rises, as stated above. Accordingly, the output frequency of the voltage controlled oscillator 140 reaches near the frequency of the reference clock CLK.

On the other hand, when the frequency of the feedback clock FB is higher than the frequency of the reference clock CLK (when the phase of the feedback clock FB is ahead of the phase of the reference clock CLK), the frequency of the feedback clock FB drops and the phase difference between the feedback clock and the reference clock CLK becomes small, since the output frequency of the voltage controlled oscillator 140 drops, as stated above. Accordingly, the output frequency of the voltage controlled oscillator 140 becomes close to the frequency of the reference clock CLK.

As stated above, if the frequency of the feedback clock FB (the frequency is proportional to the output frequency of the voltage controlled oscillator 140) is higher or lower than the frequency of the reference clock CLK, the phase locked loop circuit 100 operates to make the frequency of the feedback clock FB close to the frequency of the reference clock CLK. As a result, the frequency of the voltage controlled oscillator 140 is locked to a fixed frequency.

Figure 2:
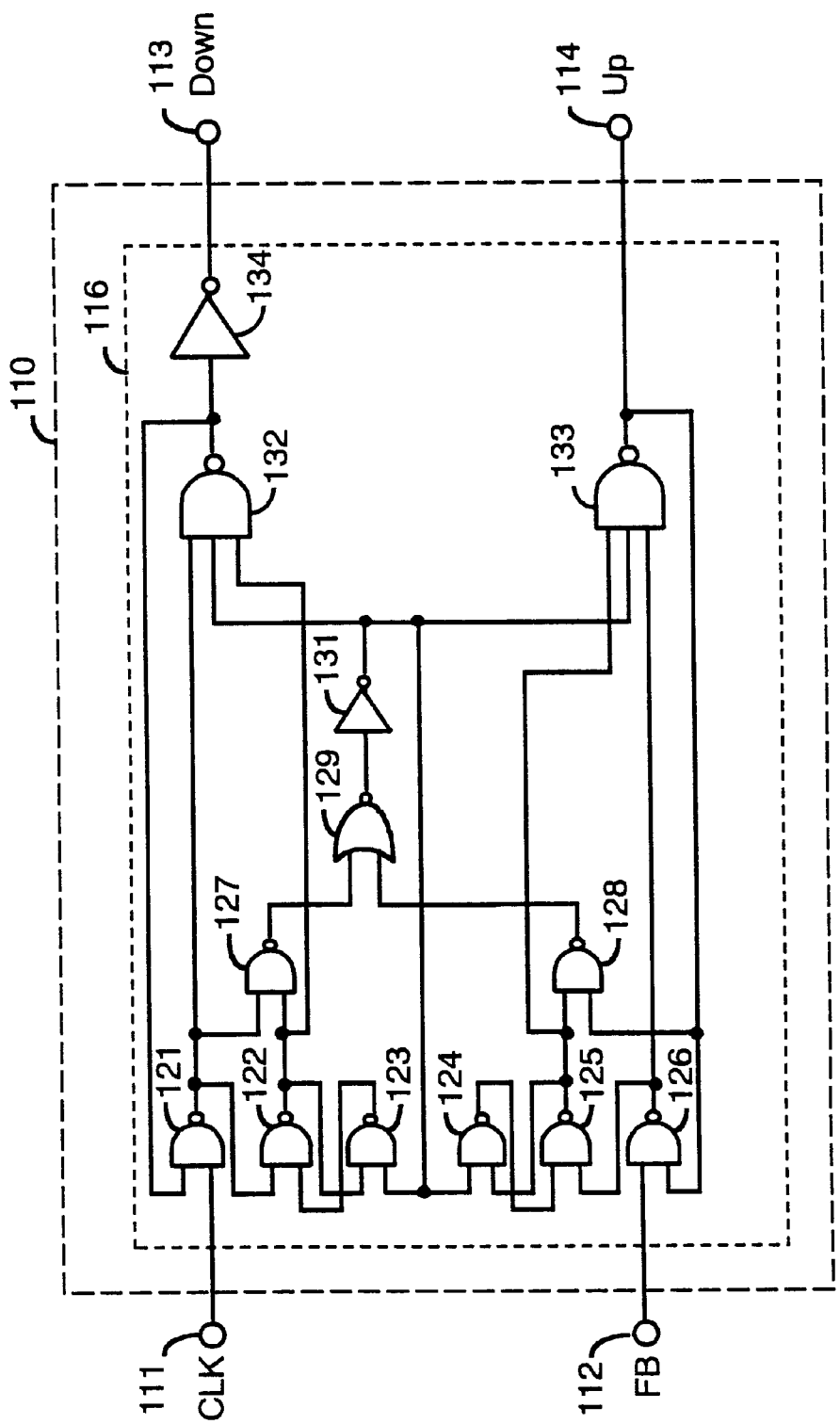
FIG. 2 illustrates a prior art phase detector.

FIG. 2 shows a prior art phase detector. The phase detector of FIG. 2 comprises a reference clock CLK input terminal 111, a feed back clock FB input terminal 112, a Down pulse output terminal 113, an Up pulse output terminal 114, a phase detector main frame portion 116, NAND circuits 121–128, a NOR circuit 129, inverters 131,134, and multiple input NAND circuits 132 and 133. In FIG. 2, the phase detector main frame portion 116 of the phase detector 110 compares the reference clock CLK which is input from the reference clock CLK input terminal 111 and the phase of the feedback clock FB which is input from the feed back clock FB input terminal 112. According to the phase relationship between the reference clock CLK and the feed back clock FB, the phase detector main frame portion 116 of the phase detector 110 outputs the Down pulse to the Down pulse output terminal 113 and the Up pulse to the Up pulse output terminal 114. Because this operation has nothing to do with the present invention directly, detailed explanation of it is omitted.

Figure 3:
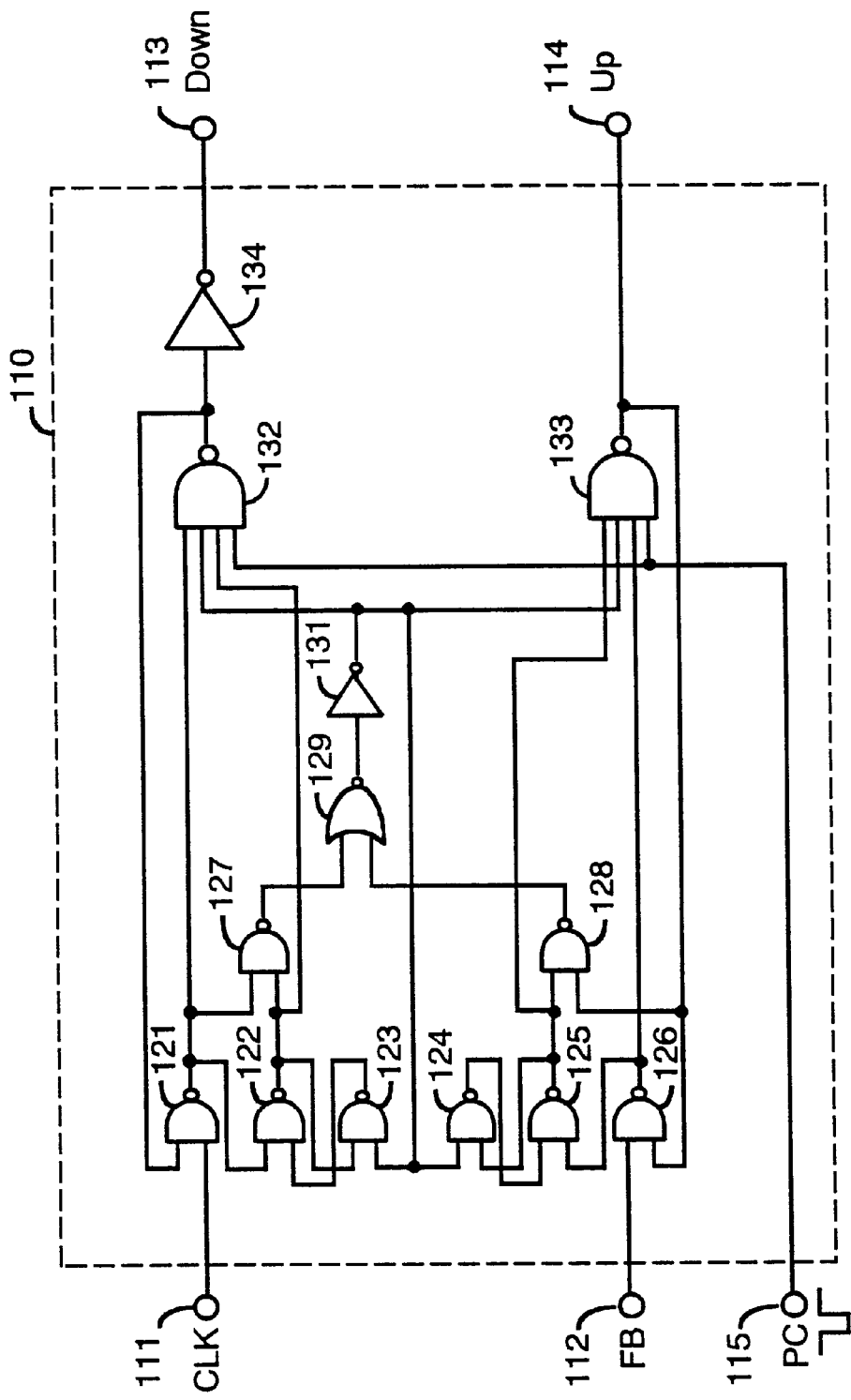
FIG. 3 shows one embodiment of the phase detector used in the present invention.

FIG. 3 shows a phase detector according to the first embodiment of the present invention. In the phase detector of FIG. 3, the multiple input NAND circuits 132 and 133 are provided with a respective power cut input terminal, to which the power cut input terminal 115 is connected. In other words, one more power cut input terminal is added to the multiple input NAND circuits 132 and 133 having 3-input terminals as shown in FIG. 2, respectively. By applying the power cut signal to the additional terminals of the multiple input NAND circuits 132 and 133 having 4 inputs, the outputs from the multiple input NAND circuits 132 and 133 are fixed at the logic "H" while the phase locked loop is in the off state. The Down pulse output terminal 113 and the Up pulse output terminal 114 are connected to the Down pulse input terminal 21 and the Up pulse input terminal 22 of the charge pump 120, respectively.

More concretely explained, the power cut signal PC is logic "H" usually. However it becomes logic "L" while the phase locked loop is in the off state. In this way, when the power cut signal PC of logic "L" level is input from the power cut input terminal 115 to the power cut input terminals of the multiple input NAND circuits 132 and 133, the outputs of the multiple input NAND circuits 132 and 133 always become logic "H", regardless of the states of the reference clock CLK and the feedback clock FB. Accordingly, while the phase locked loop is in the off state, the signal of logic "H" is output from the Up pulse output terminal 114 and the signal of logic "L" is output from the Down pulse output terminal 113 after being inverted by the inverter 134.

Figure 4:
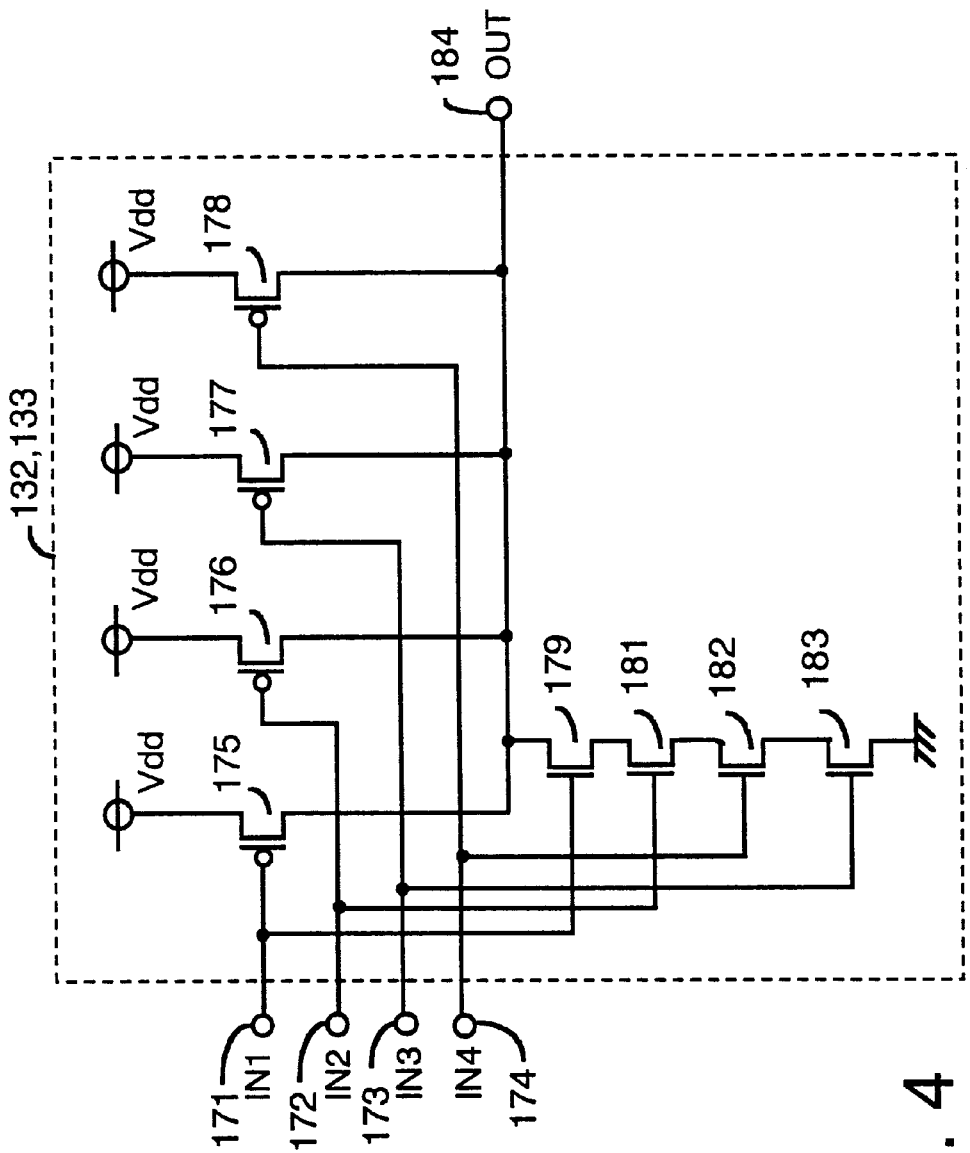
FIG. 4 shows a general 4-input NAND circuit.

FIG. 4 shows one embodiment of the multiple input NAND circuits 132 and 133, as stated above, a general NAND circuit having 4 inputs. The general NAND circuit having 4 inputs of FIG. 4 comprises input terminals 171–174, P type MOS transistors 175–178, N type MOS transistors 179–183, and an output terminal 184. The power cut signal from the power cut input terminal 115 is input to the input terminal 174. When the signal received from the power cut input terminal 115 at the input terminal 174 becomes logic "L", the output signal at the output terminal 184 becomes logic "H", regardless of the states of the input signals from the input terminals 171–173. Since such a NAND circuit is well known, detailed description of it is omitted.

The detailed operation of the charge pump 120 of the present invention is described with reference to the FIG. 5–FIG. 10. The operation of the charge pump 120 can be explained for three states as stated above. In a first state, the feedback clock FB synchronizes with the reference clock CLK. In a second state, the phase of the feedback clock FB is ahead of the phase of the reference clock CLK. In a third state, the phase of the feedback clock FB is behind the phase of the reference clock CLK.

Next, the operation of the charge pump 120 is described when the feedback clock FB synchronizes with the reference clock CLK. FIG. 5A–FIG. 5D are timing charts showing the relationship between the Down pulse and the Up pulse when the feedback clock FB synchronizes with the reference clock CLK. FIG. 5A shows a reference clock CLK signal, FIG. 5B shows the feedback clock FB signal, FIG. 5C shows a Down pulse, and FIG. 5D shows an Up pulse.

FIG. 6 illustrates the operation of the charge pump 120 when the feedback clock FB synchronizes with the reference clock CLK. In FIG. 6, when the Down pulse (logic "L") is input to the Down pulse input terminal 21, the N type MOS transistor 2 turns off and the P type MOS transistor 1 turns on. Accordingly, since the N type MOS transistor 2 turns off, current from a power supply Vdd does not flow in the P type MOS transistor 1 and the N type MOS transistor 2. The power supply voltage Vdd is applied to the gate of the P type MOS transistor 5 through the resistor 11. Therefore, the P type MOS transistor 5 turns off.

On the other hand, when the Up pulse (logic "H") is input to the Up pulse input terminal 22, the P type MOS transistor 3 turns off and the N type MOS transistor 4 turns on. At this time, current does not flow from the power supply Vdd to the P type MOS transistor 3. Therefore, the potential of the connection of the resistor 13 to the resistor 14 turns to ground potential, so that the N type MOS transistor 6 turns off. Accordingly, since the both P type MOS transistor 5 and the N type MOS transistor 6 turn off, the output terminal 23 has a high impedance state, "Hi Z". That is to say, when the voltage controlled oscillator 140 is in the off state, current does not flow anywhere through the charge pump 120, so that power is not consumed in the charge pump 120. It can be understood by easily comparing this operation with the operation of the conventional charge pump 120 of FIG. 19. In the charge pump 120 of the present invention, when the voltage controlled oscillator 140 is in the off state, in other words, when the feedback clock FB synchronizes with the reference clock CLK, the current consumption of the charge pump 120 becomes very small, since current does not flow through at any circuit of the Down pulse processing circuit 10, the Up pulse circuit 20, or the output signal processing circuit 30.

Next, the operation of the charge pump 120 is explained when the phase of the feedback clock FB is ahead of the phase of the reference clock CLK. FIG. 7A–FIG. 7D are timing charts showing the relationship between the Down pulse and the Up pulse when the phase of the feedback clock FB is ahead of the phase of the reference clock CLK. FIG. 8 illustrates a circuit construction explaining the operation of the charge pump 120 when the phase of the feedback clock FB is ahead of the phase of the reference clock CLK. FIG. 7A shows a reference clock CLK signal, FIG. 7B shows a feedback clock FB signal, FIG. 7C shows a Down pulse, and FIG. 7D shows an Up pulse. Only when the phase of the feedback clock FB is ahead of the phase of the reference clock CLK, the Down pulse output from the phase detector 110 becomes logic "L". The Up pulse is always logic "L". When such Down pulse and Up pulse are input to the Down pulse input terminal 21 and the Up pulse input terminal 22, respectively, the charge pump 120 works as follows.

When the Down pulse (logic L) is input to the Down pulse input terminal 21, the N type MOS transistor 2 turns off and the P type MOS transistor 1 turns on. As the N type MOS transistor 2 turns off, the current from the power supply Vdd does not flow through the P type MOS transistor 1 and the N type MOS transistor 2. But the power supply voltage Vdd is applied to the gate of the P type MOS transistor 5 through the resistor 11. Therefore, the P type MOS transistor 5 turns off.

On the other hand, when the Up pulse (logic L) is input to the Up pulse input terminal 22, the P type MOS transistor 3 turns on and the N type MOS transistor 4 turns off. Then, current flows from the power supply Vdd to the ground through the resistor 13 and the resistor 14. Therefore, the potential of the connection of the resistor 13 to the resistor 14 becomes substantially Vdd/2. As a result, the N type MOS transistor 6 turns on. Accordingly, the charge pump 120 discharges the capacitor of the loop filter 130 connected to the output terminal 23. In other words, it pulls the current.

The operation of the charge pump 120 when the phase of the feedback clock FB is behind the phase of the reference clock CLK is described below. FIG. 9A–FIG. 9D are timing charts showing the relationship between the Down pulse and the Up pulse when the phase of the feedback clock FB is behind the phase of the reference clock CLK. FIG. 10 illustrates a circuit construction explaining the operation of the charge pump 120 when the phase of the feedback clock FB is behind the phase of the reference clock CLK. FIG. 9A shows a reference clock CLK signal, FIG. 9B shows the feedback clock FB signal, FIG. 9C shows a Down pulse, and FIG. 9D shows an Up pulse. Only when the phase of the feedback clock FB is behind the phase of the reference clock CLK, the Up pulse output from the phase detector 110 becomes logic "H". The Down pulse is always logic "H". When such the Down pulse and the Up pulse are input to the Down pulse input terminal 21 and the Up pulse input terminal 22 of FIG. 10, respectively, the charge pump 120 works as follows.

When the Down pulse (logic "H") is input to the Down pulse input terminal 21, the N type MOS transistor 2 turns on and the P type MOS transistor 1 turns off. Accordingly, the current flows from the power supply Vdd to the ground through the resistor 11, the resistor 12 and the N type MOS transistor 2. Therefore, the potential of the connection of the resistor 11 to the resistor 12 becomes substantially Vdd/2. As a result, the P type MOS transistor 5 turns on.

On the other hand, when the Up pulse (logic "H") is input to the Up pulse input terminal 22, the P type MOS transistor 3 turns on and the N type MOS transistor 4 turns off. Then, a current does not flow through the P type MOS transistor 3 from the power supply Vdd. Therefore, the potential of the connection of the resistor 13 to the resistor 14 becomes the ground. Accordingly, the N type MOS transistor 6 turns. And, the charge pump 120 charges the capacitor of the loop filter 130 connected to the output terminal 23. In other words, the charge pump 120 pushes the current.

Embodiment 2.

Figure 11:
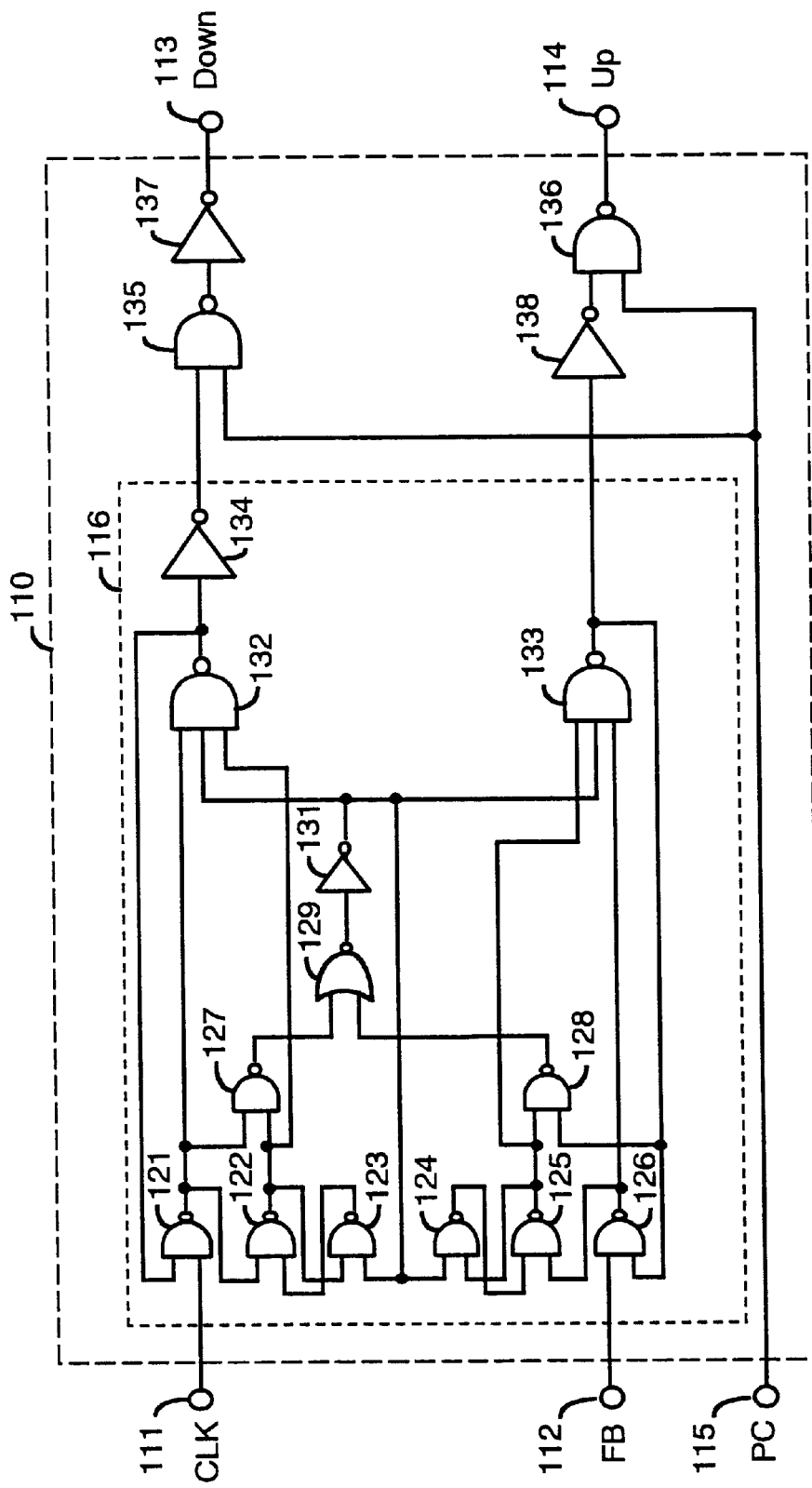
FIG. 11 shows other embodiments of the phase detector of the present invention.

FIG. 11 shows a phase detector according to a second embodiment of the present invention. The phase detector of FIG. 11 comprises a reference clock CLK input terminal 111, a feedback clock FB input terminal 112, a Down pulse output terminal 113, an Up pulse output terminal 114, a power cut input terminal 115, a main frame portion of a phase detector 116, 2-input NAND circuits 135 and 136, inverters 137 and 138. The main frame portion of a phase detector 116 comprises NAND circuits 121–128, a NOR circuit 129, an inverter 131, multiple input NAND circuits 132 and 133, and an inverter 134.

The phase detector 110 of the second embodiment has a feature in that the Down pulse and the Up pulse are switched forcibly by using the 2-input NAND circuit 135 and the 2-input NAND circuit 136 outside of the main frame portion 116. In other words, without modifying the main frame portion 116, the Down pulse and the Up pulse can be obtained by arranging the 2-input NAND circuit 135 and the 2-input NAND circuit 136 outside of the main frame portion 116.

In FIG. 11, an output signal from the inverter 134 of the main frame portion 116 is input to one input terminal of the 2-input NAND circuit 135 and an output signal from the multiple input NAND circuit 133 is input to one input terminal of the 2-input NAND circuit 136 through an inverter 138. The other input terminals of the 2-input NAND circuit 135 and the 2-input NAND circuit 136 are connected to the power cut input terminal 115, respectively.

A power cut signal PC is usually logic "H", however, it becomes logic "L" when the phase locked loop is in the off state. In this way, when a power cut signal PC at logic "L" is input from the power cut input terminal 115 to the other input terminals of the 2-input NAND circuit 135 and the 2-input NAND circuit 136, the outputs of the 2-input NAND circuit 135 and the 2-input NAND circuit 136 always becomes logic "H" regardless of the states of the reference clock CLK and the feedback clock FB. Accordingly, while the phase locked loop is in the off state, the signal of logic "H" is output from the Up pulse output terminal 114 and the signal of logic "L" is output from the Down pulse output terminal 113 after being inverted by the inverter 137.

Figure 12:
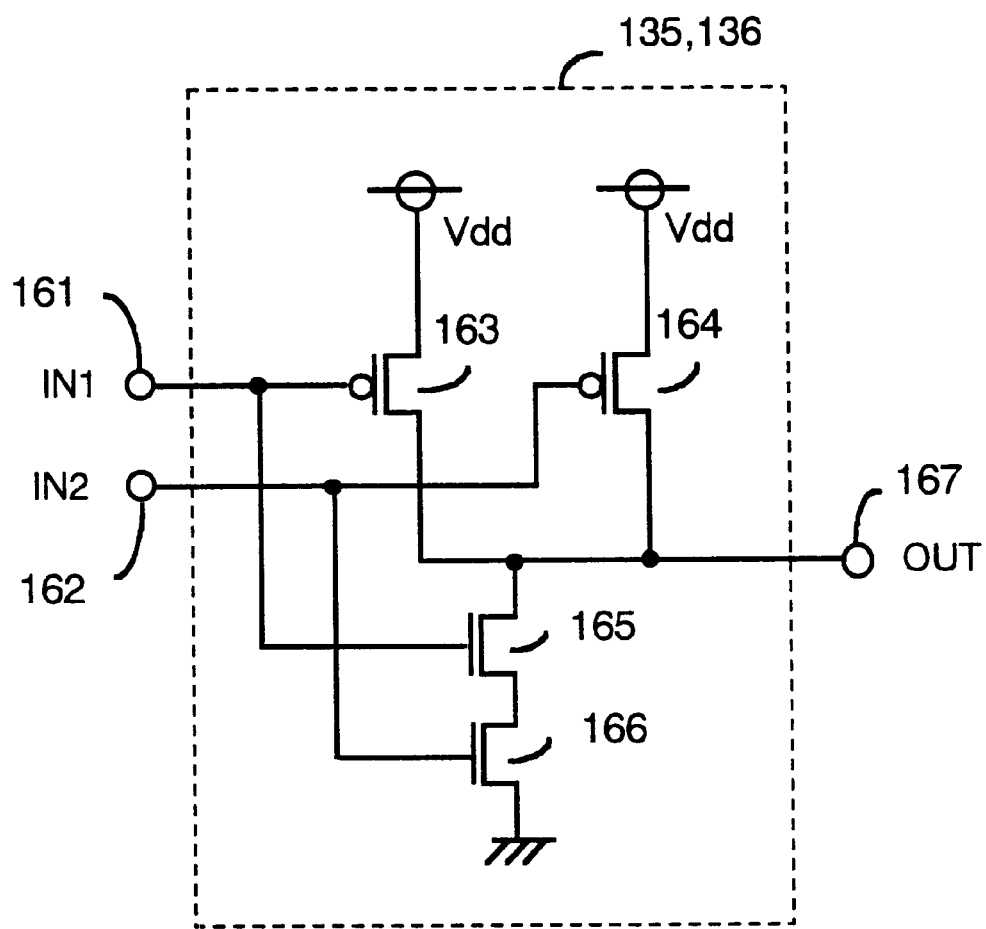
FIG. 12 shows a general 2-input NAND circuit.

FIG. 12 shows an example of general 2-input NAND circuits 135 and 136 mentioned above. The 2-input NAND circuits of FIG. 12 comprise input terminals 161 and 162, P type MOS transistors 163 and 164, N type MOS transistors 165 and 166, and an output terminal 167.

An output signal from the main frame portion 116 is input to the input terminal 161 and the power cut signal from the power cut input terminal 115 is input to the input terminal 162. When the power cut signal having logic "L" level from the power cut input terminal 115 is input to the input terminal 162, the output of the output terminal 167 always becomes logic "H", without being affected by the state of the signal appeared at the input terminal 161. Since such a 2-input NAND circuit is well known, detailed description of it is omitted.

What is claimed is:

1. A phase locked loop circuit comprising:
a phase detector receiving a reference clock, a feedback clock, and a power cut signal and generating Up pulses and Down pulses according to relative phases of the reference clock and the feedback clock;
a charge pump receiving the Down pulses and the Up pulses from the phase detector;
a loop filter charged and discharged by an output from the charge pump and generating an output voltage in response to charging and discharging of the loop filter;
a voltage controlled oscillator outputting a frequency signal having a frequency determined by the output voltage of the loop filter; and
a frequency divider for dividing the frequency signal from the voltage controlled oscillator to produce the feedback clock supplied to the phase detector, wherein the phase detector comprises:
a clock terminal receiving the reference clock;
a feedback clock terminal receiving the feedback clock;
a plurality of 2-input NAND circuits, a first group of the 2-input NAND circuits being connected in series, one of the 2-input NAND circuits of the first group receiving the reference clock, the first group of 2-input NAND circuits outputting a first output signal, and a second group of the 2-input NAND circuits being connected in series, one of the 2-input NAND circuits of the second group receiving the feedback clock, the second group of 2-input NAND circuits outputting a second output signal;
a NOR circuit coupled to the first and second output signals of the first and second groups of 2-input NAND circuits;
a first inverter inverting an output signal from the NOR circuit;
first and second multiple input NAND circuits respectively receiving the first and second output signals from the first and second groups of the 2-input NAND circuits, both of the first and second multiple input NAND circuits receiving output signals from the first inverter and the power cut signal;
a second inverter connected to an output terminal of the first multiple input NAND circuit;
a Down terminal connected to an output terminal of the second inverter for outputting the Down pulses; and
an Up terminal connected to an output terminal of the second multiple input WAND circuit for outputting the Up pulses, wherein the phase detector changes the Down pulses and the Up pulses, respectively, to opposite logic levels, in response to the power cut signal supplied to the first and second multiple input NAND circuits.

2. A phase locked loop circuit comprising:
a phase detector receiving a reference clock, a feedback clock, and a power cut signal and generating Up pulses and Down pulses according to relative phases of the reference clock and the feedback clock;
a charge pump receiving the Down pulses and the Up pulses from the phase detector;
a loop filter charged and discharged by an output from the charge pump and generating an output voltage in response to charging and discharging of the loop filter;
a voltage controlled oscillator outputting a frequency signal having a frequency determined by the output voltage of the loop filter; and
a frequency divider for dividing the frequency signal from the voltage controlled oscillator to produce the feedback clock supplied to the phase detector, wherein the phase detector comprises:
a clock terminal for receiving the reference clock;
a feedback clock terminal for receiving the feedback clock;
a main frame portion comprising,
a plurality of 2-input NAND circuits, a first group of the 2-input NAND circuits being connected in series, one of the 2-input NAND circuits of the first group receiving the reference clock, the first group of 2-input NAND circuits outputting a first output signal, and a second group of the 2-input NAND circuits being connected in series, one of the 2-input NAND circuits of the second group receiving the feedback clock, the second group of 2-input NAND circuits outputting a second output signal;

a NOR circuit coupled to the first and second output signals of the first and second groups of 2-input NAND circuits;

a first inverter inverting an output signal from the NOR circuit;

first and second multiple input NAND circuits respectively receiving the first and second output signals from the first and second groups of the 2-input NAND circuits, both of the first and second multiple input NAND circuits receiving output signals from the first inverter;

a second inverter connected to an output terminal of the first multiple input NAND circuit;

a first 2-input NAND circuit having a first input terminal connected to an output of the second inverter and a second input terminal connected to the power cut signal;

a third inverter having an input connected to an output terminal of the second multiple input NAND circuit;

a second 2-input NAND circuit having a first input terminal connected to an output of the third inverter and a second input terminal connected to the power cut signal;

a fourth inverter having an input terminal connected to an output terminal of the first 2-input NAND circuit;

a Down terminal connected to an output terminal of the fourth inverter for outputting the Down pulses; and an Up terminal connected to an output terminal of the second 2-input NAND circuit for outputting the Up pulses, wherein the phase detector changes the Down pulses and the Up pulses, respectively, to opposite logic levels, in response to the power cut signal supplied to the second input terminals of the first and second 2-input NAND circuits.

* * * * *